(12) United States Patent
Yan et al.

(10) Patent No.: US 11,805,614 B2
(45) Date of Patent: Oct. 31, 2023

(54) CONTACT PROTECTION COVER HELD IN A LOCKED POSITION BY A CIRCUIT BREAKER

(71) Applicant: Robert Bosch GmbH, Stuttgart (DE)

(72) Inventors: Yu Yan, Suzhou (CN); Wei Zhu, Suzhou (CN); Changhai Zhang, Suzhou (CN); Rui Zhao, Suzhou (CN)

(73) Assignee: Robert Bosch GmbH, Stuttgart (DE)

( * ) Notice: Subject to any disclaimer, the term of this patent is extended or adjusted under 35 U.S.C. 154(b) by 375 days.

(21) Appl. No.: 17/235,435

(22) Filed: Apr. 20, 2021

(65) Prior Publication Data
US 2021/0329801 A1    Oct. 21, 2021

(30) Foreign Application Priority Data

Apr. 21, 2020   (CN) .......................... 202010316884.7

(51) Int. Cl.
| | |
|---|---|
| *B60R 16/023* | (2006.01) |
| *H05K 5/02* | (2006.01) |
| *H01H 9/20* | (2006.01) |
| *H05K 5/03* | (2006.01) |
| *H01R 13/70* | (2006.01) |
| *H01R 13/639* | (2006.01) |

(52) U.S. Cl.
CPC ....... *H05K 5/0221* (2013.01); *B60R 16/0239* (2013.01); *H01H 9/20* (2013.01); *H01R 13/70* (2013.01); *H05K 5/03* (2013.01); *H01R 13/639* (2013.01)

(58) Field of Classification Search
CPC .. B60R 16/0239; H01R 13/639; H01R 13/70; H01R 13/4538; H01R 33/97; H01H 9/20; H01H 9/28; H01H 9/25; H01H 9/285; H01H 85/20; H01H 85/25; H01H 85/54; H05K 5/03
See application file for complete search history.

(56) References Cited

U.S. PATENT DOCUMENTS

| | | | | |
|---|---|---|---|---|
| 6,482,019 | B1 * | 11/2002 | Lo Forte | H01R 13/453 |
| | | | | 439/131 |
| 7,740,504 | B2 * | 6/2010 | Chikamatsu | H01H 85/54 |
| | | | | 337/186 |
| 9,251,985 | B2 * | 2/2016 | Garascia | H01H 9/20 |
| 9,260,080 | B2 * | 2/2016 | Maguire | B60L 3/0046 |
| 9,397,459 | B2 * | 7/2016 | Butcher | H01R 33/95 |
| 10,278,297 | B1 * | 4/2019 | Cheng | H01M 50/264 |

\* cited by examiner

*Primary Examiner* — Vanessa Girardi
(74) *Attorney, Agent, or Firm* — Michael Best & Friedrich LLP

(57) ABSTRACT

An electrical arrangement (1), comprising a housing (2) having a housing opening (20), an electrical component (3) within the housing (20), a power supply connection (4), a contact protection cover (5), and a circuit breaker (6) which can be inserted into the housing (2), wherein, in the inserted state, the circuit breaker (6) connects the electrical component (3) to the power supply connection (4) and, in the withdrawn state, the circuit breaker (6) disconnects the connection, wherein the contact protection cover (5) can be fastened to the housing (2) in a locking position in which the contact protection cover (5) covers the housing opening (20), and wherein, in the inserted state, the circuit breaker (6) locks the contact protection cover (5) in the locking position.

14 Claims, 4 Drawing Sheets

CONTACT PROTECTION COVER HELD IN A LOCKED POSITION BY A CIRCUIT BREAKER

BACKGROUND

The present invention relates to an electrical arrangement and to a vehicle.

Electrical arrangements having electrical components, such as inverters for example, which are accommodated in housings are known. Removable covers are commonly provided to provide accessibility to the interior of the housing, for example for maintenance purposes. If such a cover is removed, a power supply to the electrical component can be simultaneously interrupted, for example by means of a switch integrally formed with the cover. Covers of this type are frequently fastened to the housing by means of elastic clips. Such clips can break easily and consequently lose their holding function.

SUMMARY

By contrast, the electrical arrangement according to the invention offers the advantage of a very simple and cost-effective arrangement which has a robust construction to allow a long service life. This is achieved according to the invention by an electrical arrangement, comprising a housing having a housing opening, an electrical component within the housing, a power supply connection, a contact protection cover, and a circuit breaker. The housing is preferably designed to hold and/or to protect the electrical component. For example, the housing can be formed from metal. The housing opening in this case offers access from the outside into the interior of the housing, in particular to gain access to the electrical component, for example for maintenance purposes. The power supply connection preferably passes through a wall of the housing in order to allow power to be supplied to the electrical component from outside of the housing. In particular, a power supply line can be connected to an outer side of the power supply connection for this purpose.

The circuit breaker can be inserted into the housing. In the inserted state, the circuit breaker connects the electrical component to the power supply connection. In the withdrawn state, the circuit breaker disconnects the connection between the electrical component and the power supply connection.

The contact protection cover can be fastened to the housing in a locking position, wherein the contact protection cover covers the housing opening, in particular completely, in the locking position. The contact protection cover therefore prevents accessibility to the interior of the housing, in particular to the electrical component, from the outside in the locking position.

In the inserted state, the circuit breaker locks the contact protection cover in the locking position. That is to say that configuring the electrical arrangement such that the contact protection cover is in the locking position and the circuit breaker is inserted causes the contact protection cover to be locked to the housing, wherein in this case the contact protection cover cannot be removed without withdrawing the circuit breaker.

The contact protection cover is therefore locked by means of an additional component, as a result of which the contact protection cover can be fastened to the housing in a particularly secure and reliable manner. Due to the fact that the prior withdrawal of the circuit breaker is necessary to remove the contact protection cover, it is additionally ensured that the power supply to the electrical component is always interrupted before the contact protection cover can be removed so as to obtain accessibility to the interior of the housing.

In the withdrawn state of the circuit breaker, the contact protection cover can preferably be moved into a removal position. In the removal position, the contact protection cover can be removed from the housing. That is to say that the contact protection cover can only be removed from the housing after it has been moved from the locking position into the removal position. Such a movement from the locking position into the removal position is in turn only possible after the circuit breaker has been removed. In other words, starting from a completely closed configuration in which the contact protection cover is in the locking position and the circuit breaker is inserted, the circuit breaker first has to be withdrawn. The contact protection cover can then be moved into the removal position. Then, the contact protection cover in the removal position can be removed from the housing in order to gain access to the interior of the housing. Such a stepwise opening of the housing, wherein it is not possible to remove the contact protection cover directly after the circuit breaker has been withdrawn, but rather the contact protection cover has to be first moved into the removal position, particularly reliably ensures that the power supply to the electrical component is interrupted as soon as the interior of the housing is accessible. In particular, a certain time, for example in the range of 1 to 3 seconds, is necessary in this case to have complete access to the interior of the housing following interruption to the power supply. This ensures, for example, that components accessible through the housing opening can only be contacted using a tool, or by an operator, after they have been completely or substantially discharged after the power supply has been disconnected.

Particularly preferably, an insertion direction of the circuit breaker is perpendicular to a movement direction of the contact protection cover. The movement direction of the contact protection cover here is considered to be a direction in which the contact protection cover can be moved from the locking position into the removal position, or vice versa. Preferably, a withdrawal direction in which the circuit breaker can be withdrawn is opposite and parallel to the insertion direction. The movement direction of the contact protection cover preferably lies in a plane of a housing surface. Unintentional detachment of the circuit breaker can be avoided by a perpendicular arrangement of the two directions. Self-clamping is achieved in particular through the perpendicular orientation of the two directions, as a result of which the circuit breaker is held reliably and unintentional detachment, for example on account of vibrations, is avoided.

Preferably, the contact protection cover can be moved translationally and/or rotationally from the locking position into the removal position, and vice versa. That is to say that a linear displacement and/or a rotation of the contact protection cover is/are required to be able to remove or lock the contact protection cover. Preferably, a combined movement can be used to obtain particularly reliable locking of the contact protection cover in the locking position. Particularly simple and rapid fastening and removal of the contact protection cover is preferably possible when just one translational movement in precisely one direction is required. Particularly preferably, a displacement from the locking position into the removal position, and vice versa, over a displacement distance of at least 3 mm, preferably at most 10 mm, occurs.

Particularly preferably, in the inserted state, the circuit breaker projects through a cover opening of the contact protection cover. That is to say that the circuit breaker, when the contact protection cover is in the locking position, can be inserted into the housing from outside of the housing through the cover opening. Preferably, the circuit breaker can be inserted only when the contact protection cover is in the locking position. In the inserted state, therefore, a part of the circuit breaker is outside of the housing, wherein this part is in particular designed in such a way that an operator can grasp it to withdraw the circuit breaker.

More preferably, the contact protection cover is held on the housing in a form-fitting manner in the locking position in order to achieve fastening of the contact protection cover that is particularly reliable, reversible, and easy to release.

Advantageously, the contact protection cover has at least one tab. The tab projects into the interior of the housing when the contact protection cover is in the locking position. In this case the tab engages with an edge of the housing opening to enable the fastening cover to be held on the housing in a form-fitting manner. In particular, "engaging" here is considered to be an overlapping arrangement, when viewed along a removal direction of the contact protection cover. Preferably, the tab protrudes from a base surface of the, for example plate-shaped, contact protection cover. A tab of this type thus affords a particularly simple way of holding the contact protection cover on the housing in a form-fitting manner. Preferably, multiple tabs are provided to enable fixing that is particularly reliable and firm. In particular, a tab of this type can be of rigid design, and preferably have a cross section that is sufficient to avoid unintentional breaking.

Preferably, the housing has at least one recess on an edge of the housing opening. The recess of the housing and the tab of the contact protection cover are arranged in such a way that they are aligned when the contact protection cover is in the removal position. That is to say that the recess preferably has a geometry adapted to the tab, such that the tab can be moved out of the housing through the recess when the contact protection cover is in the removal position. In particular, displacement of the cover from the removal position into the locking position creates the engaging arrangement of tab and edge in which the contact protection cover is held on the housing in a form-fitting manner.

Preferably, the electronic arrangement further comprises a housing cover which can be fastened to the housing. The housing cover is configured to cover the housing opening and/or the contact protection cover and/or the circuit breaker when the housing cover is fastened to the housing. In particular, the housing cover prevents the circuit breaker from being able to be withdrawn. That is to say that the housing cover has to be removed before the circuit breaker can be removed. Preferably, the housing cover can be fastened to the housing by means of screws. In particular, the housing cover can be configured to seal the housing, for example against the ingress of water.

Particularly preferably, the contact protection cover is in the form of a stamped part. The contact protection cover in this case can be in the form of a straight plate, for example, wherein tabs preferably protrude from the plate for form-fitting fastening to the housing. Alternatively or additionally, the cover can be formed from plastic. In both variants, it is therefore possible for the contact protection cover to be manufactured in a particularly cost-effective and simple manner. Advantageously, the electrical component comprises an inverter. The inverter can be configured to be connected to a battery and/or to an electric motor by way of the power supply connection, for example.

The invention furthermore leads to a vehicle which comprises an arrangement as described above. The vehicle is preferably an electric motor vehicle. The electrical arrangement can be connected to a battery and/or to one or more electric motor(s) of the electric motor vehicle, for example.

BRIEF DESCRIPTION OF THE DRAWINGS

The invention is described below with reference to an exemplary embodiment in conjunction with the figures. In the figures, functionally equivalent components are denoted by the same reference signs in each case. In the figures.

DETAILED DESCRIPTION

Figure 1:
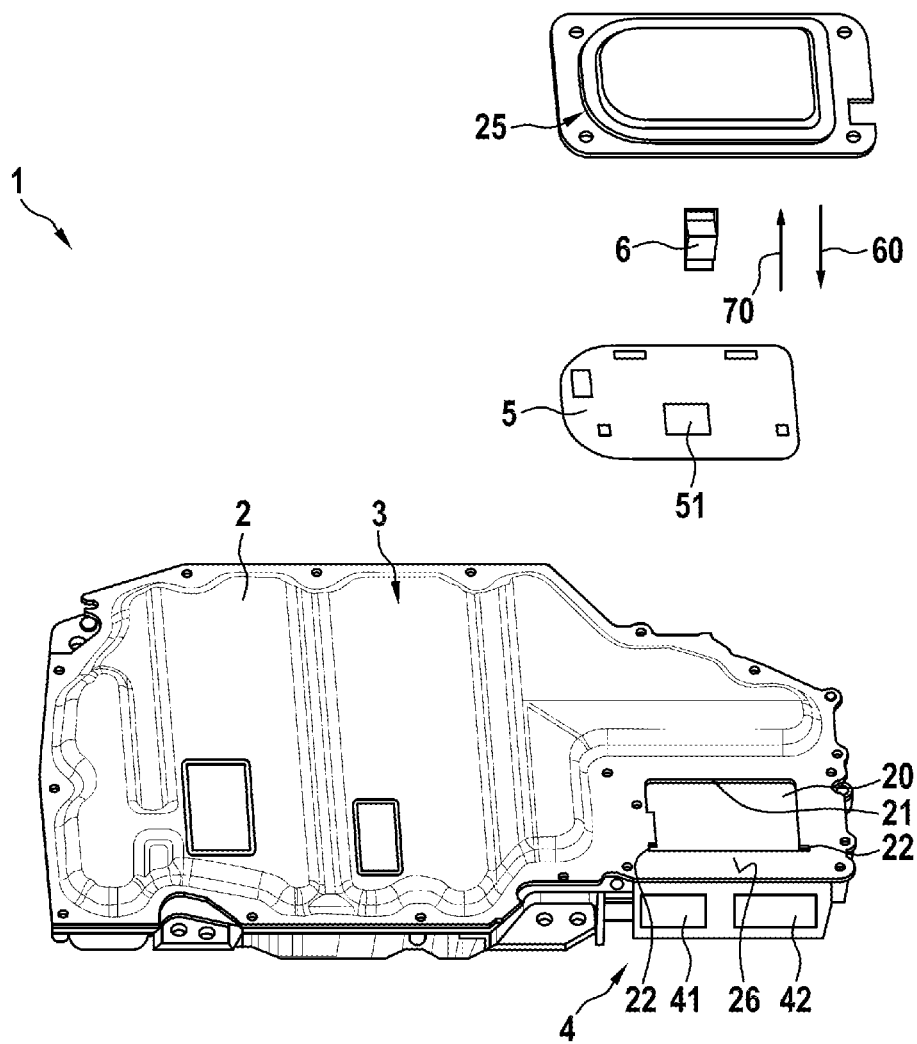
FIG. 1 shows an exploded view of an electrical arrangement according to a preferred exemplary embodiment of the invention.

FIG. 1 shows an exploded view of an electrical arrangement 1 according to a preferred exemplary embodiment of the invention. The electrical arrangement 1 comprises an electrical component 3 which is accommodated within a housing 2. The housing 2 has a housing opening 20 which offers access into the interior of the housing 2.

The housing opening 20 is arranged in the region of a power supply connection 4. The power supply connection 4 has a first connector 41 and a second connector 42, to each of which a power line can be connected in order to allow power to be supplied to the electrical component 3.

The electrical arrangement 1 furthermore has a contact protection cover 5 and a circuit breaker 6. The contact protection cover 5 is plate-shaped and can be fastened to the housing 2 in a locking position in order to cover the housing opening 20. In the locking position, access into the interior of the housing 20 is blocked by the contact protection cover 5. In the inserted state, the circuit breaker 6 locks the contact protection cover 5 in the locking position. The manner in which the contact protection cover 5 and circuit breaker 6 are fastened and removed will be described in detail below with reference to FIGS. 2 to 5.

Figure 2:
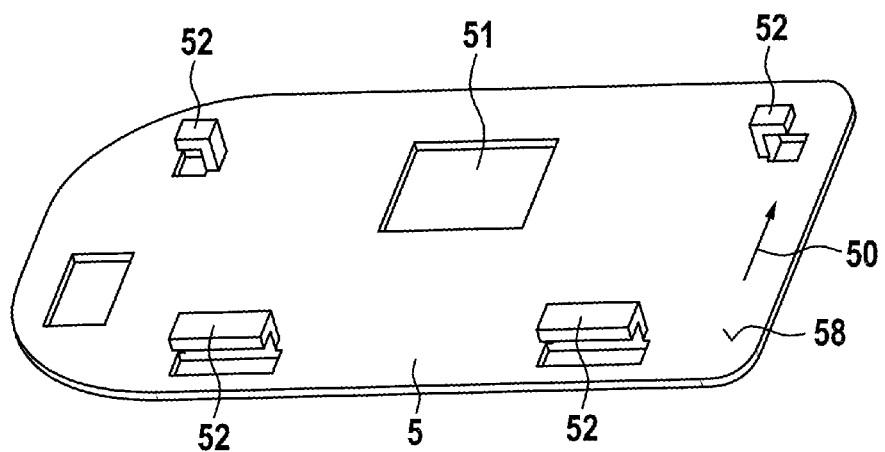
FIG. 2 shows a view of an underside of a contact protection cover of the electrical arrangement from FIG. 1.

FIG. 2 shows a perspective view of the contact protection cover 5, wherein the underside of the contact protection cover 5 that is facing into the interior of the housing 2 is visible. The contact protection cover 5 has four tabs 52 which extend away from a lower surface 58. The tabs 52 here are designed in such a way that they are oriented in three different directions when viewed along the plane of the lower surface 58. The tabs 52 are provided here to project into the interior of the housing 2 in the locking position of the contact protection cover 5 in order to engage with an edge 21 of the housing opening 20, as is illustrated in FIG. 3.

Figure 3:
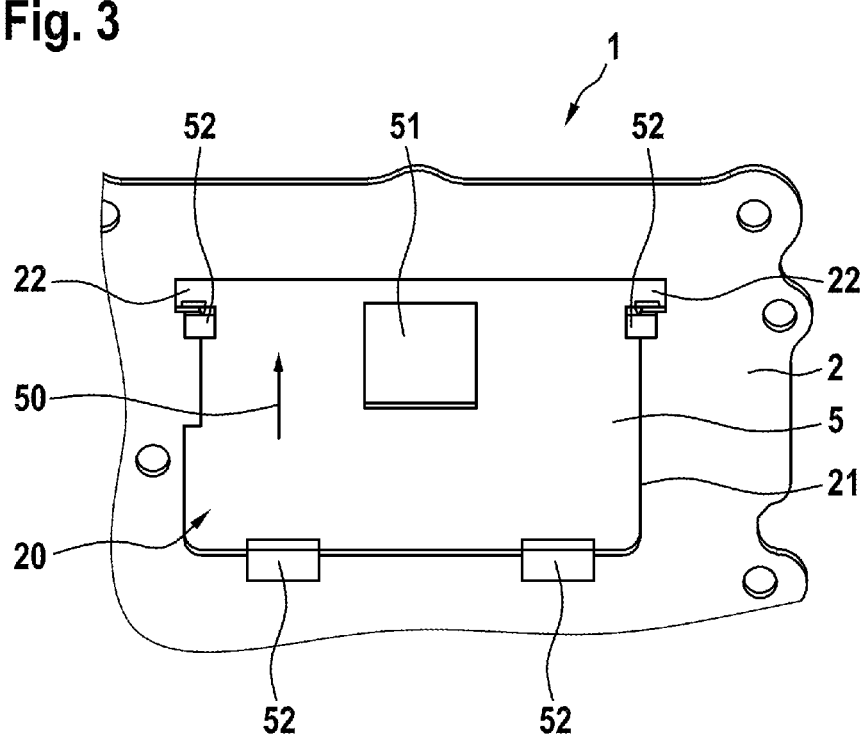
FIG. 3 shows a detailed view of the electrical arrangement from FIG. 1 with the contact protection cover in a locking position.

FIG. 3 shows a view of the electrical arrangement 1, wherein the contact protection cover 5 is in the locking position. What is illustrated here is a view in the viewing direction from the interior of the housing 2 toward the outside. As can be seen, each tab 52 respectively engages around a part of an edge 21 of the housing opening 20, such that the contact protection cover 5 is held on the housing 2 in a form-fitting manner. In detail, the tabs 52 prevent the contact protection cover 5 from being removed in a removal direction 70 perpendicular to a housing surface 26 (cf. FIG. 1).

Since the tabs 52 are oriented in three directions, and are correspondingly in engagement with three sides of the housing edge 21 of the substantially rectangular housing opening 20, the contact protection cover 5 can be displaced in a movement direction 50 parallel to the housing surface 26 starting from the locking position illustrated in FIG. 3. In this case, the contact protection cover 5 can be moved from the locking position depicted in FIG. 3 into a removal position.

Figure 4:
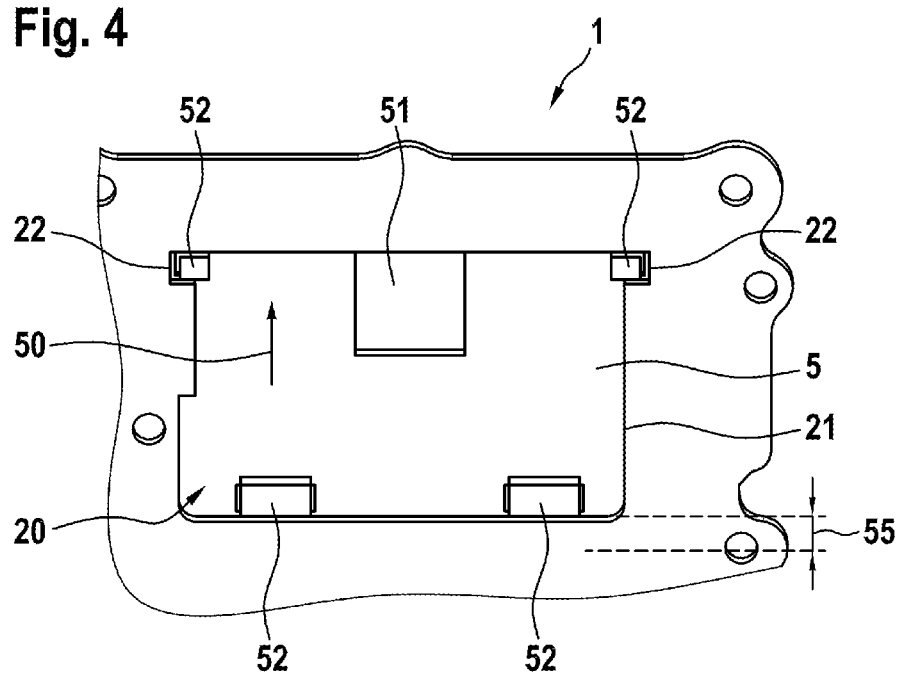
FIG. 4 shows a detailed view of the electrical arrangement from FIG. 1 with the contact protection cover in a removal position.

The removal position of the contact protection cover 5 is illustrated in FIG. 4. In comparison to the locking position, in this removal position the contact protection cover 5 is displaced in the movement direction 50 by a predefined displacement distance 55. The displacement distance 55 is indicated here by way of example on the basis of one of the lower tabs 52.

In the removal position, the contact protection cover 5 is displaced to such an extent that the two lower tabs 52 are arranged in alignment with the housing opening 20. Additionally, the two upper tabs 52 are arranged in alignment with in each case one recess 22 on the edge 21 of the housing opening 20. In the removal position there is therefore no engagement between the tabs 52 and the edge 21 such that the contact protection cover 5 can be removed from the housing 2 in the removal direction 70.

Figure 5:
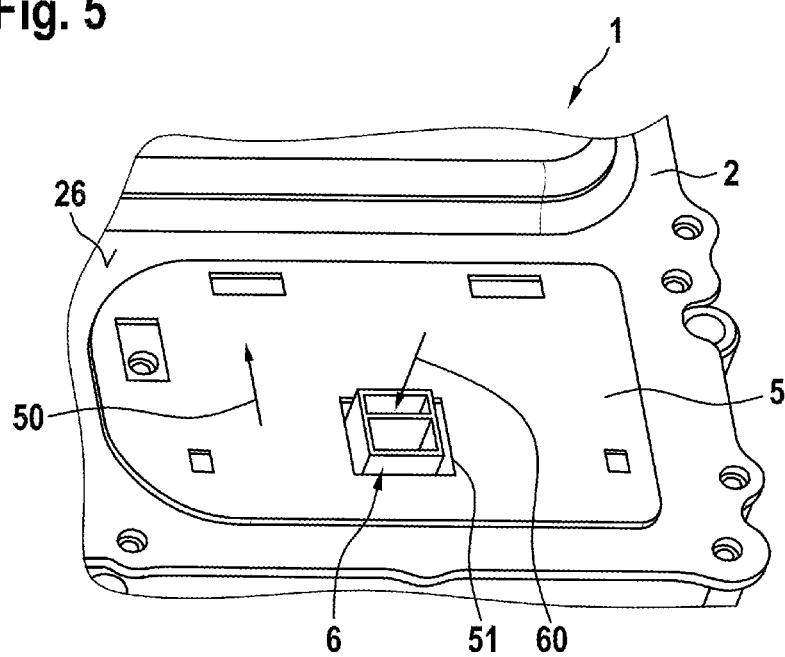
FIG. 5 shows a detailed view of the electrical arrangement in a similar manner to FIG. 4.

The electrical arrangement 1 furthermore comprises the circuit breaker 6 which can be inserted into the housing 2 in an insertion direction 60. The inserted state is illustrated in FIG. 5 which in a similar manner to FIG. 3 shows the electrical arrangement with the contact protection cover 5 arranged in the locking position. In the inserted state, the circuit breaker 6 projects through a cover opening 51 of the contact protection cover 5. The circuit breaker 6 thereby blocks the movement of the contact protection cover 5, as a result of which the latter is locked in the locking position. That is to say that the contact protection cover 5 can only be moved from the locking position into the removal position in the movement direction 50 after the circuit breaker 6 has been completely withdrawn from the housing 2 and also from the cover opening 51.

In addition to blocking and enabling the movement of the contact protection cover 5 in the movement direction 50, the circuit breaker 6 additionally performs a function of providing or disconnecting the power supply to the electrical component 3. In detail, the circuit breaker 6, in the inserted state, connects the electrical component 3 to the power supply connection 4. If the circuit breaker 6 is withdrawn, the connection is disconnected.

The electrical arrangement 1 furthermore comprises a housing cover 25 (cf. FIG. 1) which can be fastened to the housing 2. The housing cover 25 can cover the housing opening 20, the contact protection cover 5 and the circuit breaker 6, in particular to obtain fluid-tight sealing of the housing 2.

In order to gain access to the interior of the housing 2, and therefore to the electrical component 3, starting from a completely closed state of the electrical arrangement 1, the housing cover 25 is removed in a first step. The circuit breaker 6 has to then be withdrawn to release the locking of the contact protection cover 5. The contact protection cover 5 can then be moved into the removal position and removed from the housing 2 in this removal position. There is access to the interior of the housing 2 only after the contact protection cover 5 has been removed.

The particular locking of the contact protection cover 5 by means of the circuit breaker 6 results in the power supply to the electrical component 3 already being interrupted two steps before the contact protection cover 5 is actually removed. This ensures that the electrical component 3 is no longer being powered and is preferably substantially discharged as soon as the housing 2 is open.

Figure 6:
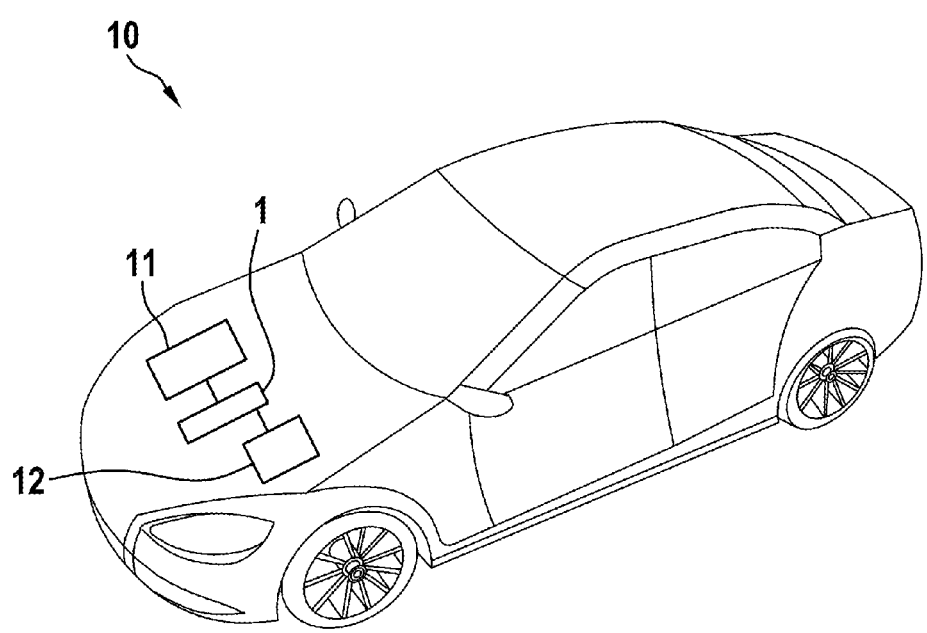
FIG. 6 shows a perspective view of a vehicle with the electrical arrangement from FIG. 1.

FIG. 6 furthermore shows a vehicle 10 with an electrical arrangement 1 as described above. The electrical arrangement 1 here is coupled to a battery 11 and to a motor 12 of the vehicle 10. The electrical component 3 of the electrical arrangement 1 in this case is an inverter.

The invention claimed is:

1. An electrical arrangement, comprising:
a housing (2) having a housing opening (20),
an electrical component (3) within the housing (2),
a power supply connection (4),
a contact protection cover (5), and
a circuit breaker (6) which can be inserted into the housing (2),
wherein, in an inserted state, the circuit breaker (6) connects the electrical component (3) to the power supply connection (4) and, in a withdrawn state, the circuit breaker (6) disconnects the connection,
wherein the contact protection cover (5) can be fastened to the housing (2) in a locking position in which the contact protection cover (5) covers the housing opening (20), and wherein, in the inserted state, the circuit breaker (6) locks the contact protection cover (5) in the locking position.

2. The electrical arrangement according to claim 1, wherein, in the inserted state, the circuit breaker (6) projects through a cover opening (51) of the contact protection cover (5).

3. The electrical arrangement according to claim 1, further comprising a housing cover (25) that can be fastened to the housing (2) in order to cover the housing opening (20) and/or the contact protection cover (5) and/or the circuit breaker (6).

4. The electrical arrangement according to claim 1, wherein the contact protection cover (5) is a stamped part and/or is formed from plastic.

5. The electrical arrangement according to claim 1, wherein the electrical component (3) comprises an inverter.

6. A vehicle comprising an electrical arrangement (1) according to claim 1.

7. The vehicle of according to claim 6, in which the vehicle is an electric motor vehicle.

8. The electrical arrangement according to claim 1, wherein the contact protection cover (5) is held on the housing (2) in a form-fitting manner in the locking position.

9. The electrical arrangement according to claim 8, wherein the contact protection cover (5) has at least one tab (52), which in the locking position projects into an interior of the housing (2) and engages with an edge (21) of the housing opening (20).

10. The electrical arrangement according to claim 9, wherein the housing (2) has at least one recess (22) on the edge (21) of the housing opening (20), and wherein the recess (22) and the tab (52) are aligned in a removal position, in which the contact protection cover (5) can be removed from the housing (2).

11. The electrical arrangement according to claim 1, wherein, when the circuit breaker (6) is withdrawn, the contact protection cover (5) can be moved into a removal position in which the contact protection cover (5) can be removed from the housing (2).

12. The electrical arrangement according to claim 11, wherein the contact protection cover (5) can be moved translationally and/or rotationally from the locking position into the removal position, and vice versa.

13. The electrical arrangement according to claim 11, wherein an insertion direction (60) of the circuit breaker (6) is perpendicular to a movement direction (50) of the contact protection cover (5) from the locking position into the removal position, or vice versa.

14. The electrical arrangement according to claim 13, wherein the contact protection cover (5) can be moved translationally and/or rotationally from the locking position into the removal position, and vice versa.

* * * * *